US008410364B2

(12) United States Patent
Dunwoody et al.

(10) Patent No.: US 8,410,364 B2
(45) Date of Patent: Apr. 2, 2013

(54) UNIVERSAL RACK CABLE MANAGEMENT SYSTEM

(75) Inventors: John Craig Dunwoody, Belmont, CA (US); Teresa Ann Dunwoody, Belmont, CA (US)

(73) Assignee: Birchbridge Incorporated, Belmont, CA (US)

( * ) Notice: Subject to any disclaimer, the term of this patent is extended or adjusted under 35 U.S.C. 154(b) by 206 days.

(21) Appl. No.: 12/840,871

(22) Filed: Jul. 21, 2010

(65) Prior Publication Data

US 2012/0019117 A1 Jan. 26, 2012

(51) Int. Cl.
*H01B 3/00* (2006.01)

(52) U.S. Cl. .................. 174/68.1; 174/72 A; 174/68.3; 439/207; 385/135; 361/688

(58) Field of Classification Search .............. 174/72 A, 174/68.1, 68.3; 439/207; 385/134, 135; 211/26; 361/688
See application file for complete search history.

(56) References Cited

U.S. PATENT DOCUMENTS

| 3,675,083 | A | 7/1972 | White |
| 3,800,097 | A | 3/1974 | Maruscak et al. |
| 4,511,950 | A | 4/1985 | Bunner et al. |
| 4,514,746 | A | 4/1985 | Lundqvist |
| 4,685,032 | A | 8/1987 | Blomstedt et al. |
| 4,938,279 | A | 7/1990 | Betker |
| 5,006,961 | A | 4/1991 | Monico |
| 5,390,081 | A | 2/1995 | St. Pierre |
| 5,450,272 | A | 9/1995 | Van Gaal et al. |
| 5,603,044 | A | 2/1997 | Annapareddy et al. |
| 5,971,804 | A | 10/1999 | Gallagher et al. |
| 5,991,163 | A | 11/1999 | Marconi et al. |
| 6,195,493 | B1 | 2/2001 | Bridges |
| 6,310,783 | B1 | 10/2001 | Winch et al. |
| 6,365,964 | B1 | 4/2002 | Koors et al. |
| 6,498,716 | B1 | 12/2002 | Salinas et al. |
| 6,536,510 | B2 | 3/2003 | Khrustalev et al. |
| 6,629,614 | B2 * | 10/2003 | Jordan ........................... 211/26 |
| 6,836,030 | B2 | 12/2004 | Smith et al. |
| 7,051,215 | B2 | 5/2006 | Zimmer et al. |
| 7,076,592 | B1 | 7/2006 | Ykema |
| 7,138,733 | B2 | 11/2006 | Sanders et al. |
| 7,222,339 | B2 | 5/2007 | Rothman et al. |
| 7,278,273 | B1 | 10/2007 | Whitted et al. |
| 7,312,987 | B1 | 12/2007 | Konshak |
| 7,389,046 | B1 | 6/2008 | Tanaka et al. |
| 7,408,775 | B2 | 8/2008 | Walz et al. |

(Continued)

FOREIGN PATENT DOCUMENTS

WO WO 2012/012611 A2 1/2012

OTHER PUBLICATIONS

International Search Report for International Application No. PCT/US2011/044809, mailed Jan. 31, 2012.

*Primary Examiner* — Dhirubhai R Patel

(74) *Attorney, Agent, or Firm* — Alston & Bird LLP

(57) ABSTRACT

A cable slack management system may include a frame and a cable management module. The frame may include a plurality of perimeter frame members to provide support for a plurality of component modules. The plurality of component modules may be locatable between a first frame member and a second frame member parallel to the first frame member. The cable management module may be coupled to the first frame member and configured to slide into and out of the first frame member. The cable management module may be configured to hold a portion of one or more cables that run along the first frame member.

18 Claims, 8 Drawing Sheets

U.S. PATENT DOCUMENTS

| | | |
|---|---|---|
| 7,508,670 B1 | 3/2009 | Thorson et al. |
| 7,511,959 B2 | 3/2009 | Belady et al. |
| 7,511,960 B2 | 3/2009 | Hillis et al. |
| 7,551,971 B2 | 6/2009 | Hillis |
| 7,552,758 B2 | 6/2009 | Garner et al. |
| 7,597,582 B2 | 10/2009 | Nehling et al. |
| 7,619,893 B1 | 11/2009 | Yu |
| 7,646,109 B2 | 1/2010 | Belady et al. |
| 7,673,389 B2 | 3/2010 | Lehman et al. |
| 7,713,068 B2 | 5/2010 | Flynn et al. |
| 7,715,207 B2 | 5/2010 | Behrens et al. |
| 7,724,513 B2 | 5/2010 | Coglitore et al. |
| 7,738,251 B2 | 6/2010 | Clidaras et al. |
| 7,852,627 B2 | 12/2010 | Schmitt et al. |
| 7,854,652 B2 | 12/2010 | Yates et al. |
| 7,856,838 B2 | 12/2010 | Hillis et al. |
| 7,894,945 B2 | 2/2011 | Hillis |
| 7,907,409 B2 | 3/2011 | Wyatt et al. |
| 7,952,023 B2 * | 5/2011 | Caveney et al. ............ 174/68.1 |
| 7,952,873 B2 | 5/2011 | Glahn et al. |
| 7,957,144 B2 | 6/2011 | Goettert et al. |
| 7,983,194 B1 | 7/2011 | Genetti et al. |
| 7,990,710 B2 | 8/2011 | Hellriegel et al. |
| 8,047,904 B2 | 11/2011 | Yates et al. |
| 8,077,457 B2 | 12/2011 | Gauthier et al. |
| 8,094,453 B2 | 1/2012 | Campbell et al. |
| 8,259,450 B2 | 9/2012 | Dunwoody et al. |
| 2003/0112582 A1 | 6/2003 | Sanders et al. |
| 2004/0221604 A1 | 11/2004 | Ota et al. |
| 2005/0021847 A1 | 1/2005 | Rothman et al. |
| 2005/0213306 A1 | 9/2005 | Vos et al. |
| 2006/0082263 A1 | 4/2006 | Rimler et al. |
| 2007/0247825 A1 | 10/2007 | Bynum et al. |
| 2008/0055846 A1 | 3/2008 | Clidaras et al. |
| 2008/0094797 A1 | 4/2008 | Coglitore et al. |
| 2008/0205003 A1 | 8/2008 | Belady |
| 2008/0259555 A1 | 10/2008 | Bechtolsheim et al. |
| 2009/0126910 A1 | 5/2009 | Campbell et al. |
| 2009/0159241 A1 | 6/2009 | Lipp et al. |
| 2009/0229194 A1 | 9/2009 | Armillas |
| 2009/0237887 A1 | 9/2009 | Shibata |
| 2009/0301123 A1 | 12/2009 | Monk et al. |
| 2010/0020806 A1 | 1/2010 | Vahdat et al. |
| 2010/0051563 A1 | 3/2010 | Schreiber |
| 2010/0165565 A1 | 7/2010 | Hellriegal et al. |
| 2010/0254096 A1 | 10/2010 | Kim et al. |
| 2011/0119344 A1 | 5/2011 | Eustis |
| 2011/0157829 A1 | 6/2011 | Wormsbecher et al. |
| 2011/0175498 A1 | 7/2011 | Bash et al. |
| 2011/0175499 A1 | 7/2011 | Zhao et al. |
| 2011/0239680 A1 | 10/2011 | Dechene et al. |
| 2012/0018136 A1 | 1/2012 | Dunwoody et al. |
| 2012/0020008 A1 | 1/2012 | Dunwoody et al. |
| 2012/0020024 A1 | 1/2012 | Dunwoody et al. |
| 2012/0020349 A1 | 1/2012 | Dunwoody et al. |

* cited by examiner

UNIVERSAL RACK CABLE MANAGEMENT SYSTEM

RELATED APPLICATION

This application is related to application Ser. Nos. 12/840,788, 12/840,808, 12/840,857, 12/840,842, and 12/840,824, each filed Jul. 21, 2010, and incorporated herein by reference in their entirety.

FIELD

This application relates to rack mounted processing systems.

BACKGROUND

Current standard rack configurations are measured in rack-units (RUs). For example, a blade server may have a rack unit measuring 19 inches wide and having a pitch of 1.75 inches in height. A common computer rack form-factor is 42 RU high, which is a factor in limiting the density or number of components directly mountable into a rack. Higher density component systems are desirable since they require less space per rack enclosure and ultimately less space within the building housing the enclosures. Often these buildings must include high price high maintenance false floors to accommodate the mass of cabling and the delivery of chilled air and power to the enclosures. Another factor in determining component density is the pitch of the rack unit as often limited by the space required for component heat sinks and associated cooling components (e.g., fans).

Of particular concern is the cooling of the rack's components. During operation, the electrical components produce heat, which a system must displace to ensure the proper functioning of its components. In addition to maintaining normative function, various cooling methods, such as liquid or air cooling, are used to either achieve greater processor performance (e.g., overclocking), or to reduce the noise pollution caused by typical cooling methods (e.g., cooling fans and heat sinks). A frequently underestimated problem when designing high-performance computer systems is the discrepancy between the amount of heat a system generates, particularly in high performance and high density enclosures, and the ability of its cooling system to remove the heat uniformly throughout the rack enclosure.

Other factors may also impact heat removal efficiency. For example, bundles of excess cabling may be stuffed into void spaces and limit heat removal from such spaces. Thus, it may be advantageous to provide a mechanism that improves management of excess cable within a rack enclosure.

SUMMARY

In one embodiment, a cable slack management system is provided. The slack management system may include a frame and a cable management module. The frame may include a plurality of perimeter frame members to provide support for a plurality of component modules. The plurality of component modules may be locatable between a first frame member and a second frame member parallel to the first frame member. The cable management module may be coupled to the first frame member and configured to slide into and out of the first frame member. The cable management module may be configured to hold a portion of one or more cables that run along the first frame member.

In another exemplary embodiment, a cable management system for a rack mounted network platform is provided. The cable management system may include a rack frame, a plurality of shelves, one or more modules and one or more cable management modules. The rack frame may include a plurality of perimeter frame members to provide support for a plurality component modules insertable through a module insertion area on a first side of the rack frame having a first frame member and a second frame member parallel to the first frame member. The plurality of shelves may be coupled to the perimeter frame members within the rack frame. Each shelf may have a first surface and a second surface. The plurality of shelves may be substantially parallel to each other and substantially perpendicular to the plane of the first side of the rack. The one or more modules may be inserted through the module insertion area between the first frame member and the second frame member. At least one of the one or more modules is in operable communication with one or more cables. The one or more cable management modules may be coupled to at least one of the first frame member and the second frame member. Each cable management module is configured to slide into and out of a corresponding one of the first frame member or the second frame member. The cable management module is configured to hold a portion of the one or more cables configured to run along the corresponding one of the first frame member or the second frame member.

BRIEF DESCRIPTION OF THE DRAWINGS

The present invention is illustrated by way of example, and not by way of limitation, in the figures of the accompanying drawings in which.

DETAILED DESCRIPTION

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

Embodiments of the present invention generally relate to an architecture for a scalable modular data system. In this regard, embodiments of the present invention relate to a rack system (e.g., rack system 10) that may contain a plurality of service units or modules. The rack system described herein provides physical support, power, and cooling for the service units or modules contained therein. The rack system also provides a set of interfaces for the service units or modules including mechanical, thermal, electrical, and communication protocol specifications. Moreover, the rack system described herein may be easily networked with a plurality of instances of other rack systems to create the highly scalable modular architecture referenced above.

Each service unit or module that may be housed in the rack system provides some combination of processing, storage, and communication capacity enabling the service units to provide functional support for various computing, data processing and storage activities (e.g., as servers, storage arrays, network switches, etc.). However, embodiments of the present invention provide a mechanical structure for the rack system and the service units or modules that provides for efficient heat removal from the service units or modules in a compact design. Thus, the amount of processing capability that can be provided for a given amount of energy consumption may be increased.

In addition to the efficient removal of heat to provide for an ability to concentrate more processing power and storage capability in a smaller area, embodiments of the present invention may also provide for improved rack cable management. In this regard, excess cable may be stored in an efficient and organized fashion. Thus, rather than simply bundling excess cable together and stuffing the bundle into a void within the rack system, which may impede access to portions of the service units or modules and also hinder heat removal efficiency, the excess cable may be accounted for in a manner that enhances accessibility to the excess cable while providing for storage of the excess cable in a manner that does not negatively impact the rack system. Thus, an exemplary rack system will be described first, and then example embodiments with cable management provided in accordance with an exemplary embodiment of the present invention will be discussed.

Figure 1:
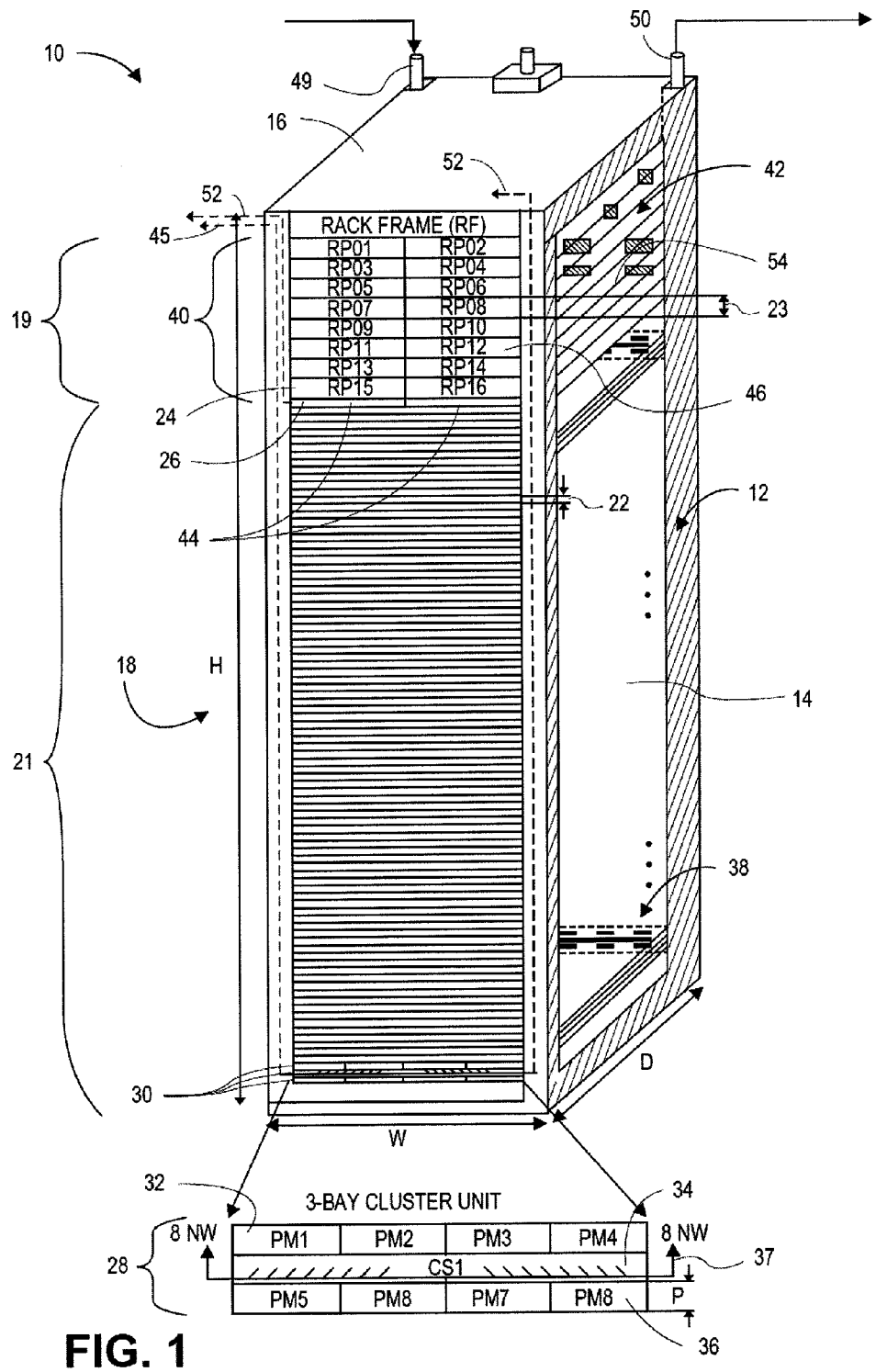
FIG. 1 illustrates an embodiment of a rack system including a cooled universal hardware platform.

FIG. 1 illustrates an embodiment of a rack system 10. Rack system 10 includes a rack power section 19 and a universal hardware platform 21. The universal hardware platform 21 includes a universal backplane mounting area 14. The rack system 10 has a perimeter frame 12 having a height 'H' width 'W' and depth 'D.' In one embodiment, the perimeter frame 12 includes structural members around the perimeter of the rack system 10 and is otherwise open on each vertical face. In other embodiments some or all of the rack's faces or planes may be enclosed, as illustrated by rack top 16.

The front side of the rack, rack front 18, may include a multitude of cooled partitions substantially parallel to each other and at various pitches, such as pitch 22 (P), where the pitch may be equal to the distance between the first surface of one cooled partition to the second surface of an adjacent cooled partition. The area or volume between each partition defines a module bay, such as module bay 24 or module bay 26. Each module bay may have a different size based on their respective pitches, such as pitch 22 corresponding to module bay 26 and pitch 23 corresponding to module bay 24. It can be appreciated that the pitch may be determined any number of ways, such as between the mid lines of each partition or between the inner surfaces of two consecutive partitions. In one embodiment, the pitch 22 is a standard unit of height, such as 0.75 inches, and variations of the pitch, such as pitch 23, may be a multiple of the pitch 23. For example, pitch 23 is two times the pitch 22, where pitch 22 is the minimum pitch based on module or other design constraints.

The rack system 10, and specifically the universal hardware platform 21, may be configured to include a multitude of service units. Each service unit may provide a combination of data processing capacity, data storage capacity, and data communication capacity. In one embodiment the rack system 10 provides physical support, power, and cooling for each service unit that it contains. A service unit and its corresponding service unit backplane correspond to a rack unit model. The rack unit model defines a set of interfaces for the service unit, which include mechanical, thermal, electrical, and communication-protocol specifications. Thus, any service unit that conforms to the interfaces defined by a particular rack unit model may be installed and operated in a rack system that includes the corresponding service unit backplane. For example, the service unit backplane mounts vertically to the universal backplane mounting area 14 and provides the connections according to the rack unit model for all of the modules that perform the functions of the service unit.

Cluster unit 28 is an example of a service unit configured to provide processing and switching functions to sixteen data nodes. In this embodiment, the cluster unit 28 spans over three module bays, module bays 30, and includes eight processing modules and a cluster switch. Specifically, the cluster unit 28 includes the four processing modules 32 (PM1-PM4) in the first module bay, a cluster switch 34 (CS1) in the second module bay, and the remaining processing modules 36 (PM5-PM8) in the third module bay.

Each of these modules may slide into their respective slots with the module bay and connect into a service unit backplane, such as cluster unit backplane 38. The cluster unit backplane 38 may be fastened to the perimeter frame 12 in the universal backplane mounting area 14. The combination of the cluster switch 34 and the cluster unit backplane 38 in this embodiment has the advantage of signal symmetry, where the signal paths of the processing modules 32 and 36 are equidistant to the cluster switch 34.

In one embodiment, the cluster switch 34 has 8 network lines exiting out of the front of the cluster switch 34 at a forty-five degree angle toward each side of the rack front 18, see for example network lines 37. For simplicity, only one cluster switch (e.g., cluster switch 34) is shown, however it can be appreciated that a multitude of cluster switches may be included in the rack system 10. Thus, the cables or network lines for every installed cluster switch may run up the perimeter frame 12 and exit the rack top 16 in a bundle, as illustrated by net 52.

In various embodiments, some or all of the service units, such as the cluster unit 28 including the processing modules 32 and the cluster switch 34, are an upward-compatible enhancement of mainstream industry-standard high performance computing (HPC)-cluster architecture, with x86_64 instruction set architecture (ISA) and standard Infiniband networking interconnects. This enables one hundred percent compatibility with existing system and application software used in mainstream HPC cluster systems and is immediately useful to end-users upon product introduction, without extensive software development or porting. Thus, implementation of these embodiments includes using commercial off the shelf (COTS) hardware and firmware whenever possible, and does not include any chip development or require the development of complex system and application software. As a result, these embodiments dramatically reduce the complexity and risk of the development effort, improve energy efficiency, and provide a platform to enable application development for concurrency between simulation and visualization computing to thereby reducing data-movement bottlenecks. The efficiency of the architecture of the embodiments applies equally to all classes of scalable computing facilities, including traditional enterprise-datacenter server farms, cloud/utility computing installations, and HPC clusters. This broad applicability maximizes the ability for significant improvements in energy and environmental efficiency of computing infrastructures. However, it should be noted that custom circuit and chip designs could also be used in the disclosed rack system design, but would not likely be as cost effective as using COTS components.

Returning to the discussion of FIG. 1, the cluster unit backplane 38 may be a single circuit board with connectors corresponding to their counterpart connectors on each module of the cluster unit 28, and the cluster unit backplane 38 may have a height of approximately the height of the (three) module bays 30. In other embodiments, the cluster unit backplane 38 may be composed of two or more circuit boards with corresponding connectors, or the cluster unit backplane 38 may be single circuit board that supports two or more cluster units (e.g., cluster unit 28) over a multitude of module bays.

The optional rack power section 19 of the rack system 10 may include rack power and management unit 40 composed of two rack management modules 44 and a plurality of rack power modules 46 (e.g., RP01-RP16). In another embodiment, the rack management modules 44 and a corresponding rack management backplane (not shown) may be independent of the rack power unit 40 and may be included in the universal hardware platform 21. In one embodiment, there may be two modules per module bay, such as the two rack power modules in module bay 24 and the two rack management modules 44 in module bay 26.

The rack management modules 44 may provide network connectivity to every module installed in the rack system 10. This includes every module installed in the universal hardware platform 21 and every module of the rack power section 19. Management cabling 45 provides connectivity from the rack management modules 44 to devices external to the rack system 10, such as networked workstation or control panel (not shown). This connectivity may provide valuable diagnostic and failure data from the rack system 10 and in some embodiments provide an ability to control various service units and modules within the rack system 10.

As with the backplane boards of the universal hardware platform 21, the back plane area corresponding to the rack power section 19 may be utilized to fasten one or more backplane boards. In one embodiment, a rack power and management backplane 42 is a single backplane board with connectors corresponding to their counterpart connectors on each of the rack management modules 44 and the rack power modules 46 of the rack power and management unit 40. The rack power and management backplane 42 may then have a height of approximately the height of the collective module bays corresponding to the rack power and management unit 40. In other embodiments, the rack power and management backplane 42 may be composed of two or more circuit boards with corresponding connectors.

In one embodiment, the rack power modules 46 are connected to the power inlet 48 (See e.g., FIGS. 2 and 3), which may be configured to receive three-phase alternating current (AC) power from a source external to the rack system 10. The rack power modules 46 convert the three-phase AC into direct current (DC). For example, the rack power modules 46 may convert a 480 volt three-phase AC input to 380 volt DC for distribution in the rack system 10. In one embodiment, the DC voltage from the rack power modules 46 is connected to power bus 67 (See e.g., FIGS. 2 and 3) running down from the rack power and management backplane 42 to other service unit backplanes, such as the cluster unit backplane 38.

The rack system 10 may include a coolant system having a coolant inlet 49 and coolant outlet 50. The coolant inlet 49 and the coolant outlet 50 are connected to piping running down through each partition's coolant distribution nodes (e.g., coolant distribution node 54) to provide the coolant into and out of the cooled partitions. For example, coolant (refrigerant R-134a) flows into the coolant inlet 49, through a set of vertically spaced, 0.1 inch thick horizontal cooled partitions (discussed below with reference to FIG. 3) and out of the coolant outlet 50. As discussed above, the space between each pair of adjacent cooled partitions is a module bay. Waste heat is transferred via conduction, first from the components within each module (e.g., processing modules 32) to the module's top and bottom surfaces, and then to the cooled partitions at the top and bottom of the module bay (e.g., module bays 30). Other coolant distribution methods and hardware may also be used without departing from the scope of the embodiments disclosed herein.

Thus, embodiments of the rack system 10 including one or all of the compact features based on modularity, cooling, power, pitch height, processing, storage and networking provide, among others, energy efficiency in system manufacturing, energy efficiency in system operation, cost efficiency in system manufacturing and installation, cost efficiency in system maintenance, space efficiency of system installations, and environmental impact efficiency throughout the system lifecycle.

Figure 2:
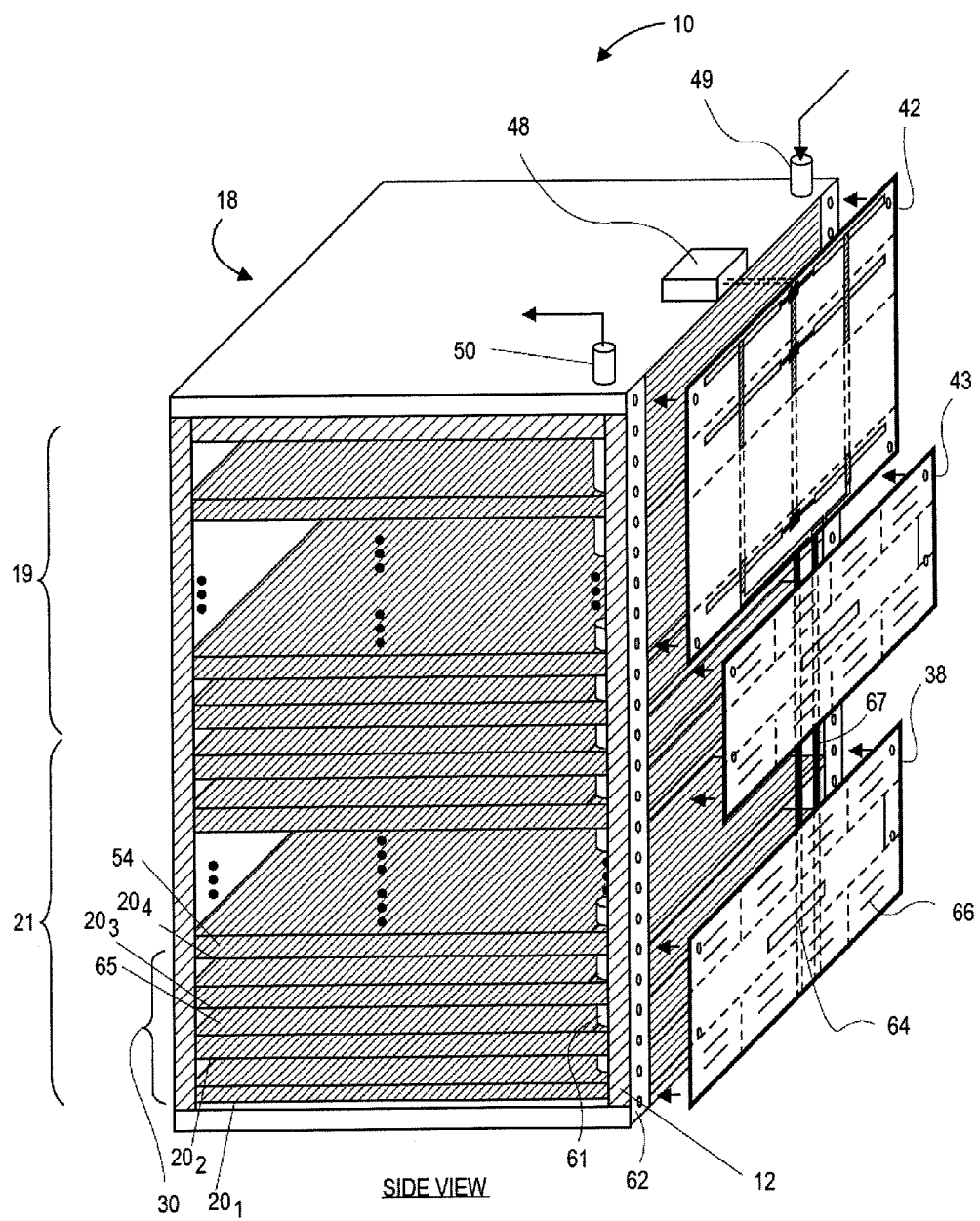
FIG. 2 illustrates a portion of the side of the rack system and the cooled universal hardware platform, according to one embodiment.

FIG. 2 illustrates a portion of the side of the rack system 10, according to one embodiment. FIG. 2 shows the rack power section 19 and the universal hardware platform 21 as seen form an open side and rear perspective of the rack system 10. The three module bays of the module bays 30 are made up of four cooled partitions, cooled partitions $20_1$, $20_2$, $20_3$, and $20_4$. Each module bay includes two partitions, in this embodiment an upper and a lower partition. For example, module bay 65 is the middle module bay of the three module bays, module bays 30, and has cooled partition $20_2$ as the lower cooled partition and $20_3$ as the upper cooled partition. As will be discussed in further detail below, functional modules may be inserted into module bays, such as module bay 65, and thermally couple to the cooled partitions to cool the modules during operation.

The coolant distribution node 54 is illustrated on cooled partition $20_4$, and in this embodiment, is connected to the coolant distribution nodes of other cooled partitions throughout the rack via coolant pipe 61 running up the height of the rack and to the coolant outlet 50. Similarly, a coolant pipe may be connected to the opposite end of each of the cooled partitions at a second coolant distribution node and the coolant inlet 49.

The perimeter frame 12 of the rack system 10 may include a backplane mounting surface 62 where the service unit backplanes are attached to the perimeter frame 12, such as the cluster unit backplanes 38 and 43 of the universal hardware platform 21, and the rack power and management backplane 42 of the rack power section 19. In various embodiments, the backplane mounting surface 62 may include mounting structures that conform to a multiple of a standard pitch size (P), such as pitch 22 shown in FIG. 1. The mounting structures on the surface of the service unit backplanes as well as the backplanes themselves may be configured to also conform with the standard pitch size. For example, the cluster unit backplane 38 may have a height of approximately the height of module bays 30 corresponding to a pitch of 3 P, and accordingly the structures of the backplane mounting surface 62 are configured to align with the mounting structures of the cluster unit backplane 38.

In various embodiments, the mounting structures for the backplane mounting surface 62 and the service units (e.g., cluster unit 28) may be magnetic, rails, indentations, protrusions, bolts, screws, or uniformly distributed holes that may be threaded or configured for a fastener (e.g., bolt, pin, etc.) to slide through, attach or snap into. Embodiments incorporating the mounting structures set to a multiple of the pitch size have the flexibility to include a multitude of backplanes corresponding to various functional types of service units that may be installed into the module bays of the universal hardware platform 21 of the rack system 10.

When mounted, the service unit backplanes provide a platform for the connectors of the modules (e.g., processing modules 36 of service unit 28) to couple with connectors of the service unit backplane, such as the connectors 64 and 66 of the cluster unit backplane 38 and the connectors associated with the modules of cluster unit 28 described above. The connectors are not limited to any type and may be, for example, an edge connector, pin connector, optical connector, or any connector type or equivalent in the art. Because multiple modules may be installed into a single module bay, the cooled partitions may include removable, adjustable or permanently fixed guides (e.g., flat brackets or rails) to assist with the proper alignment of the modules with the connectors of the backplane upon module insertion. In another embodiment, a module and backplane may include a guide pin and corresponding hole (not shown), respectively, to assist in module alignment.

Figure 3:
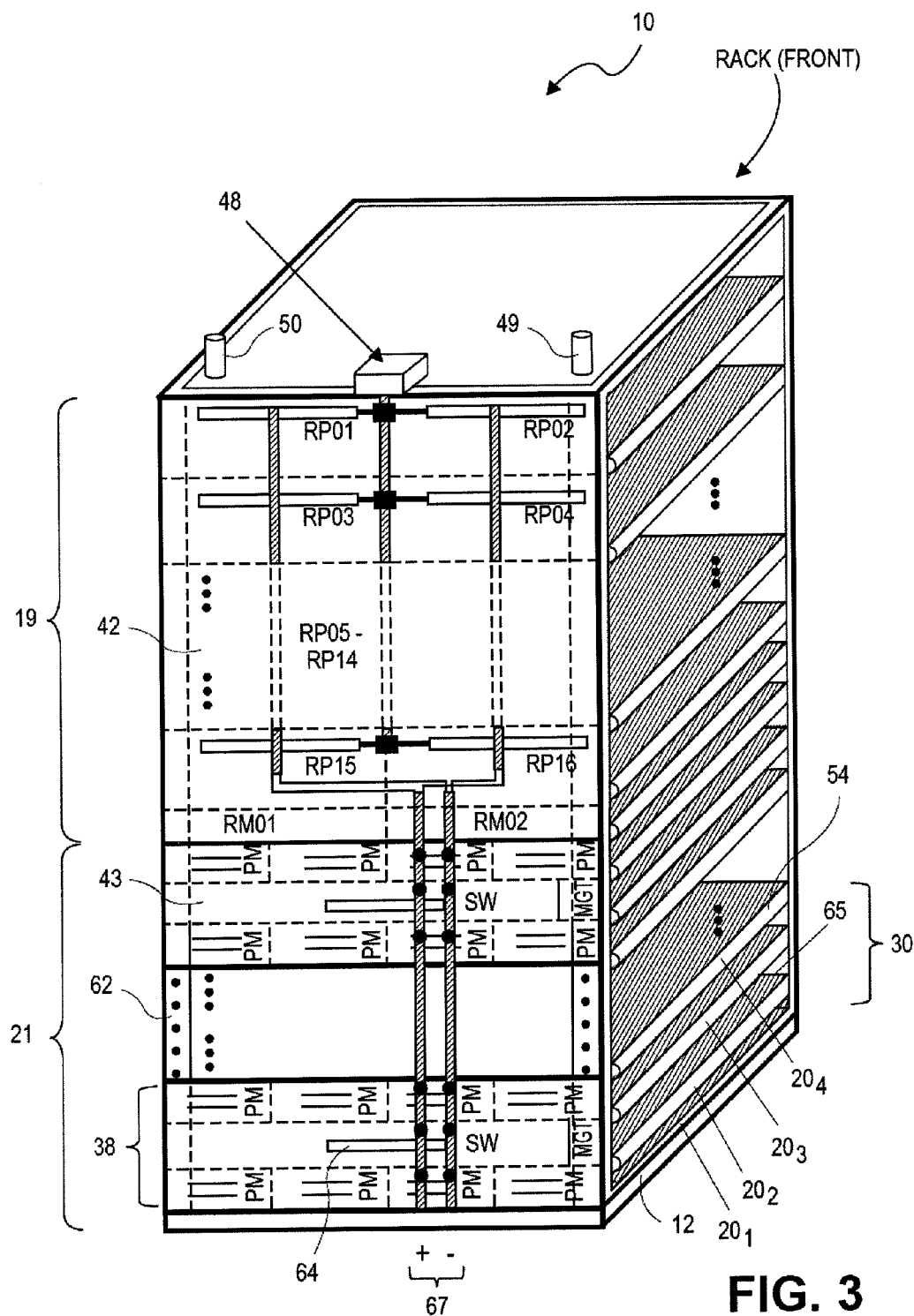
FIG. 3 illustrates an embodiment of rack system and specifically the rear portion and the open side of the rack and the cooled universal hardware platform.

FIG. 3 is an embodiment of rack system 10 illustrating the rear portion and the open side of the rack. As shown, FIG. 3 only represents a portion of the entire rack system 10, and specifically, only portions of the rack power section 19 and the universal hardware platform 21. This embodiment illustrates the power inlet 48 coupled to a power bus 67 via the rack power and management backplane 42, which as previously mentioned may convert AC power from the power inlet 48 to DC power for distribution to the service units via the service unit backplanes of the universal hardware platform 21.

In one embodiment, the power bus 67 includes two solid conductors; a negative or ground lead and a positive voltage lead connected to the rack power and management backplane 42 as shown. The power bus 67 may be rigidly fixed to the rack power and management backplane 42 or may only make electrical connection but be rigidly fixed to the backplanes as needed, such as the cluster unit backplanes 38 and 43. In another embodiment where DC power is supplied directly to the power inlet 48, the power bus 67 may be insulated and rigidly fixed to the rack system 10. Regardless of the embodiment, the power bus 67 is configured to provide power to any functional type of backplane mounted in the universal hardware platform 21. The conductors of the power bus 67 may be electrically connected to the service unit backplanes by various connector types. For example, the power bus 67 may be a metallic bar which may connect to each backplane using a bolt and a clamp, such as a D-clamp.

FIG. 3 also illustrates another view of the cooled partitions of the rack system 10. This embodiment shows the coolant distribution node 54 that is part of the cooled partitions shown, such as the cooled partitions $20_1$, $20_2$, $20_3$, and $20_4$ of module bays 30, and also shows a side view of the middle module bay, module bay 65. As discussed above, the coolant distribution node 54 may be connected to the coolant distribution nodes of the other cooled partitions via coolant pipes 61 (see e.g., FIG. 2) running up the rack and to the coolant inlet 49 and the coolant outlet 50.

The embodiments illustrated in FIGS. 1 to 3 may provide for compact provision of processing, switching and storage resources with efficient heat removal. If cables or network lines were merely provided down the perimeter frame 12 and excess cable was not properly managed, heat removal efficiency could be reduced and general disorder could exist among the cables. Accordingly, some embodiments of the present invention may provide a cable slack management system for handling excess cable or cable slack.

Figure 4:
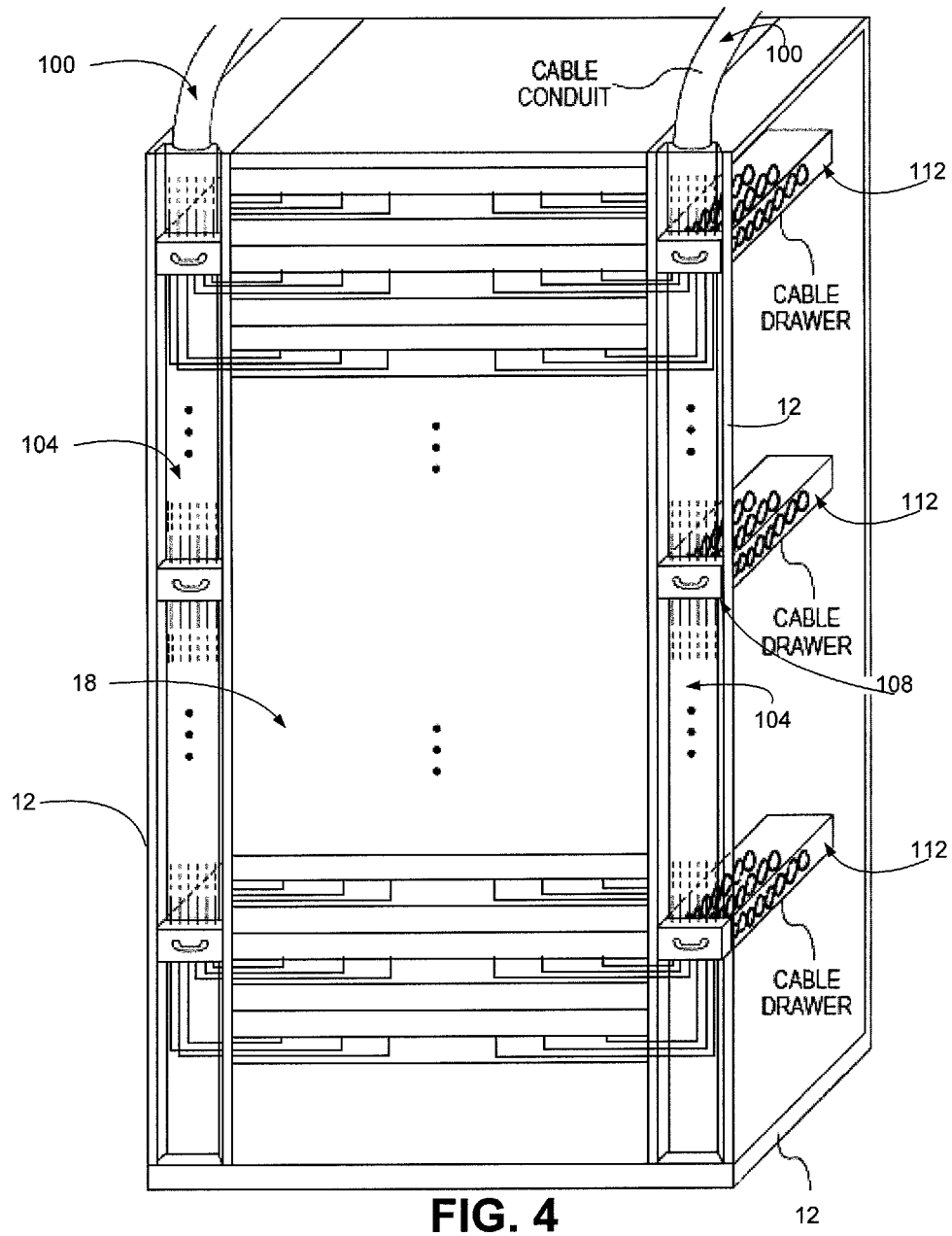
FIG. 4 illustrates an example of a cable slack management system in accordance with an example embodiment.

FIG. 4 illustrates an example of a cable slack management system in accordance with an example embodiment. In some embodiments, cabling may be provided in a cable conduit 100 that may enter the rack system 10 from above (e.g., via the rack top 16) into the perimeter frame 12. Cable may then proceed down the perimeter frame 12 via a cable way 104. The cable way 104 may extend down the length of the interior portion of the perimeter frame 12 to avoid interference with the service units of the rack system 10. In some embodiments, the cable way 104 may extend down either or both members of the perimeter frame 12 that are positioned in the rack front 18. In an exemplary embodiment, the perimeter frame 12 may include one or more drawer enclosures 108 positioned in the perimeter frame to receive a cable drawer 112. In an exemplary embodiment, the drawer enclosures 108 may be orifices within the perimeter frame 12 of the rack front 18 that permit insertion of corresponding cable drawers 112 within the rack system 10 in a direction that is substantially normal to a plane of the rack front 18. Thus, the individual frame members that form the front portion of the rack system 10 may be coupled to the drawer enclosures 108 in order to receive the cable drawers 112 in a location that is easily accessible to users.

Although FIG. 4 shows six cable drawers 112 positioned substantially equidistant from one another and symmetrical with respect to a centerline of the rack front 18, any number of cable drawers 112 could be used and the cable drawers 112 could be positioned in any desirable way. The cable drawers 112 may then be employed to contain cable slack therein to prevent excess cable from being positioned within the rack system 10 in an unorganized fashion. The cable drawers 112 may be removable from the corresponding drawer enclosures 108 or at least be extendable therefrom in order to permit access to the inside of the cable drawers 112.

Figure 5:
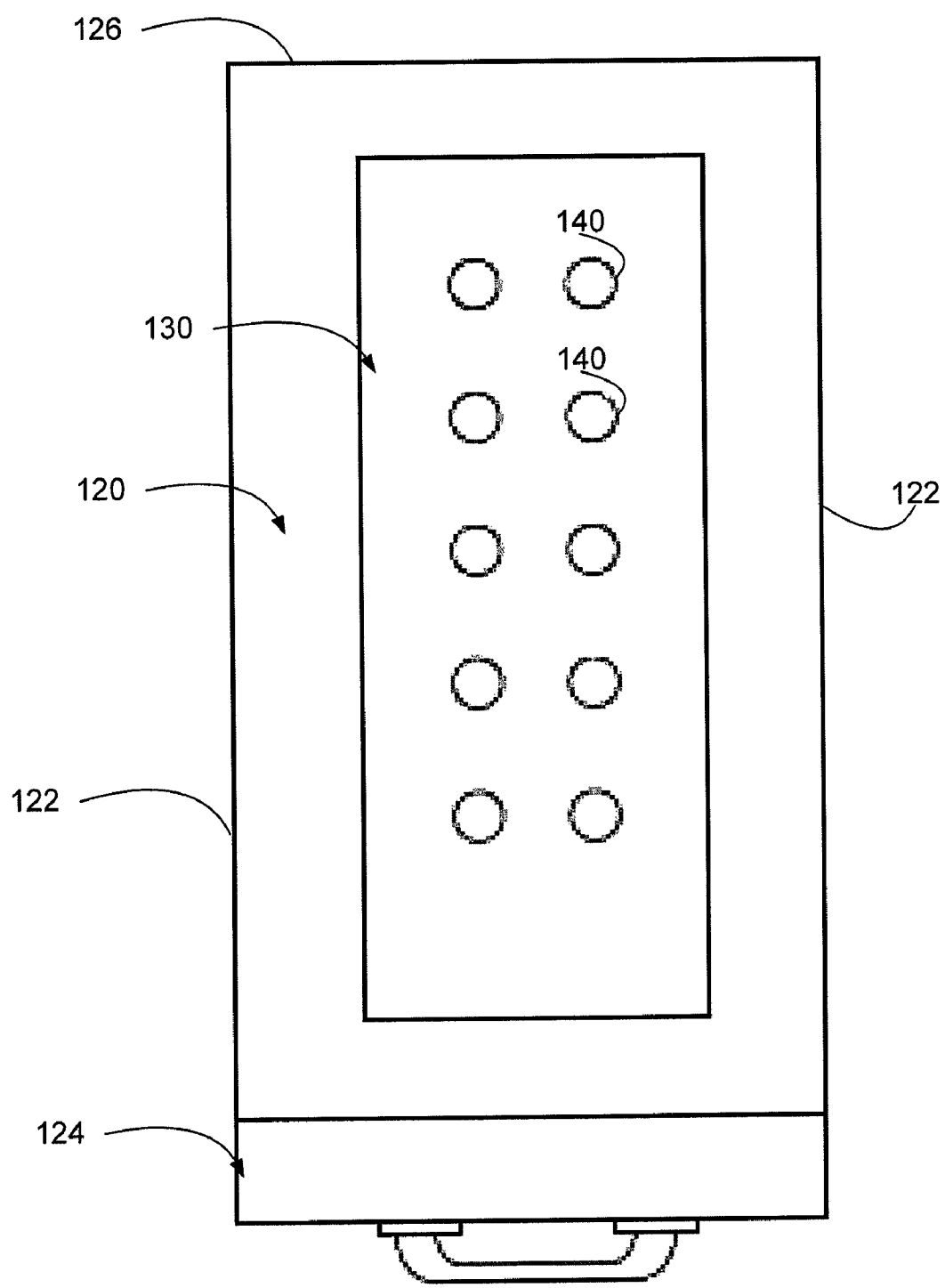
FIG. 5 shows a top view of a cable drawer according to one example embodiment.
Figure 6:
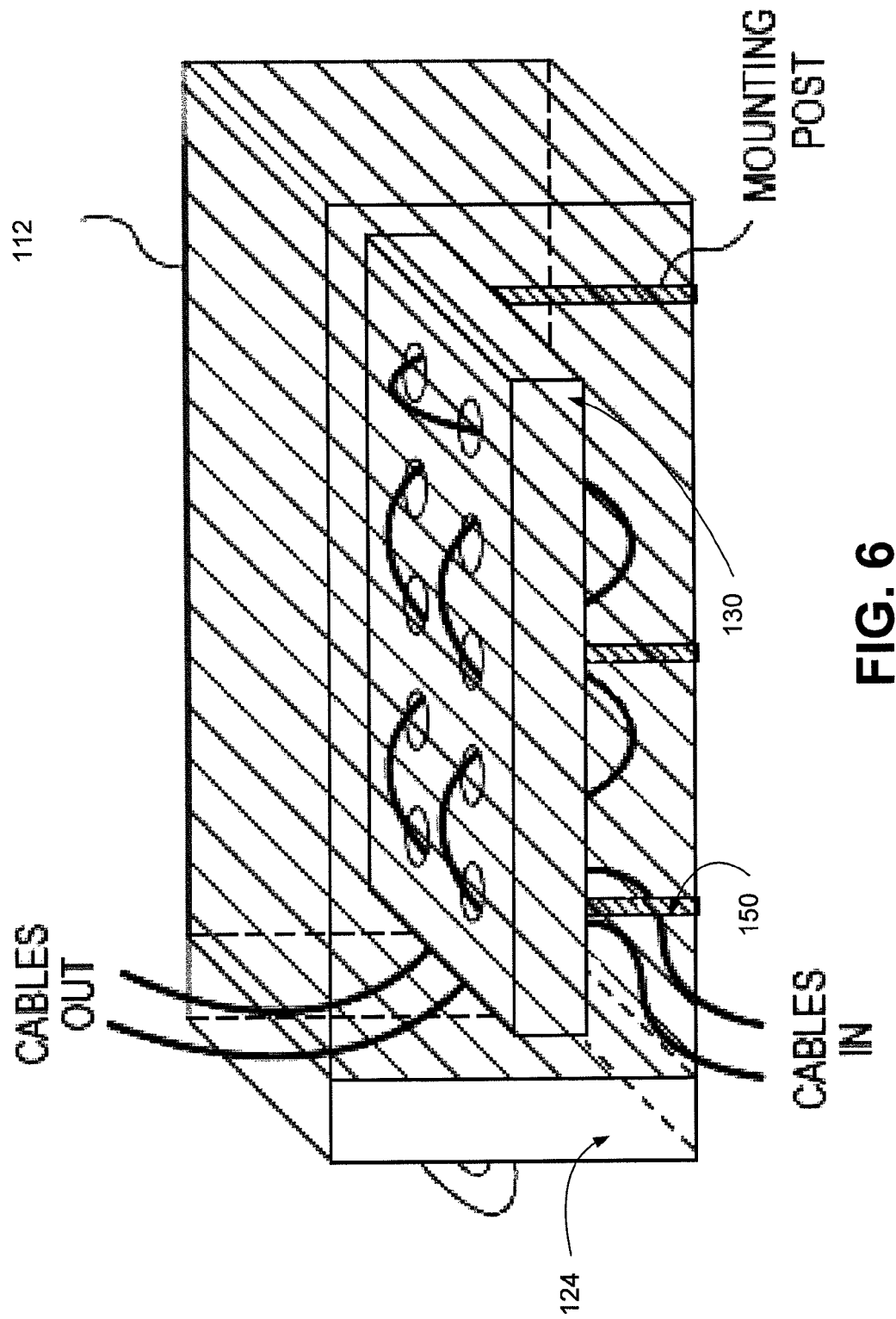
FIG. 6 shows a side view of the cable drawer with transparent side members to permit viewing of the contents of the cable drawer for ease of explanation according to an example embodiment.

FIG. 5 shows a top view of the cable drawer 112 according to one example embodiment. FIG. 6 shows a side view of the cable drawer 112 with transparent side members to permit viewing of the contents of the cable drawer 112 for ease of explanation. As shown in FIGS. 5 and 6, the cable drawer 112 may include a plurality of members positioned together to define the cable drawer 112. In an example embodiment, the cable drawer may include a bottom member 120 that supports two side members 122 that extend perpendicular to a plane of the bottom member 120 from opposite edges of the bottom member 120 relative to the longitudinal length of the bottom member 120. A front member 124 and a back member 126 may also extend from the bottom member 120 in a direction perpendicular to the plane of the bottom member 120 from opposite distal ends of the bottom member 120. The side members 122 may each abut respective opposite edges of the front member 124 and the back member 126 to define a containment volume within the cable drawer 112. In some embodiments, the cable drawer 112 may therefore have no top member to permit easy viewing and/or access to cable portions within the cable drawer 112. However, in embodiments where a top member is included, the top member may provide partial coverage of the top of the cable drawer 112 or include an opening to receive cable into the cable drawer 112. In any case, cable may enter into the cable drawer 112 via an open top of the cable drawer 112 (or an opening in the top member if one is included), and the cable may exit the cable drawer 112 via an opening in the bottom member 120 as shown in FIG. 6.

In an example embodiment one or more of the side members 122, the front member 124 and the back member 126 may be coupled to the bottom member 120 via a hinge assembly or other flexible coupling. The hinge assembly or flexible coupling may enable the corresponding members to be tilted away from the interior or center of the cable drawer 112 to enhance access to the cable drawer 112 to enable twining or winding of cables within the cable drawer 112. In an example embodiment, the cable drawer 112 may house a planar surface 130 including multiple holes or orifices 140 within the planar surface. The orifices 140 may be used to twine or wind cable in and out to provide a holding mechanism for excess or slack cable. Any pattern for twining the slack cable may be used. Thus, for example, in some cases, multiple cable passes through the orifices 140 may be employed (if cable diameter relative to orifice diameter permits), while in other cases only a single pass through each orifice may be used dependent upon the length of the slack cable. Meanwhile, in still other cases, some orifices 140 may not have cable passed through them at all dependent again upon the length of the slack cable.

In some embodiments, the planar surface 130 may be mounted to the front member 124. The mounting to the front member 124 may be a rigid mounting or a flexible mounting. For example, in some embodiments, the front member 124 may be attached to the planar surface 130 via a flexible coupling or hinge. The flexible coupling or hinge may enable the planar surface 130 to be tilted out of the cable drawer 112 to enhance access to cables therein.

In some examples, the planar surface 130 may rest on mounting posts 150. The mounting posts 150 may extend perpendicularly from a surface of the bottom member 120 and form a base upon which the planar surface 130 may be mounted. The mounting posts 150 may be used in connection with the hinge or flexible mounting to the front member 124 described above, or may be used when the planar surface 130 is rigidly mounted to the front member 124. In some embodiments, the mounting posts 150 may be employed in situations where there is no connection between the planar surface 130 and the front member 124 as well.

Figure 7:
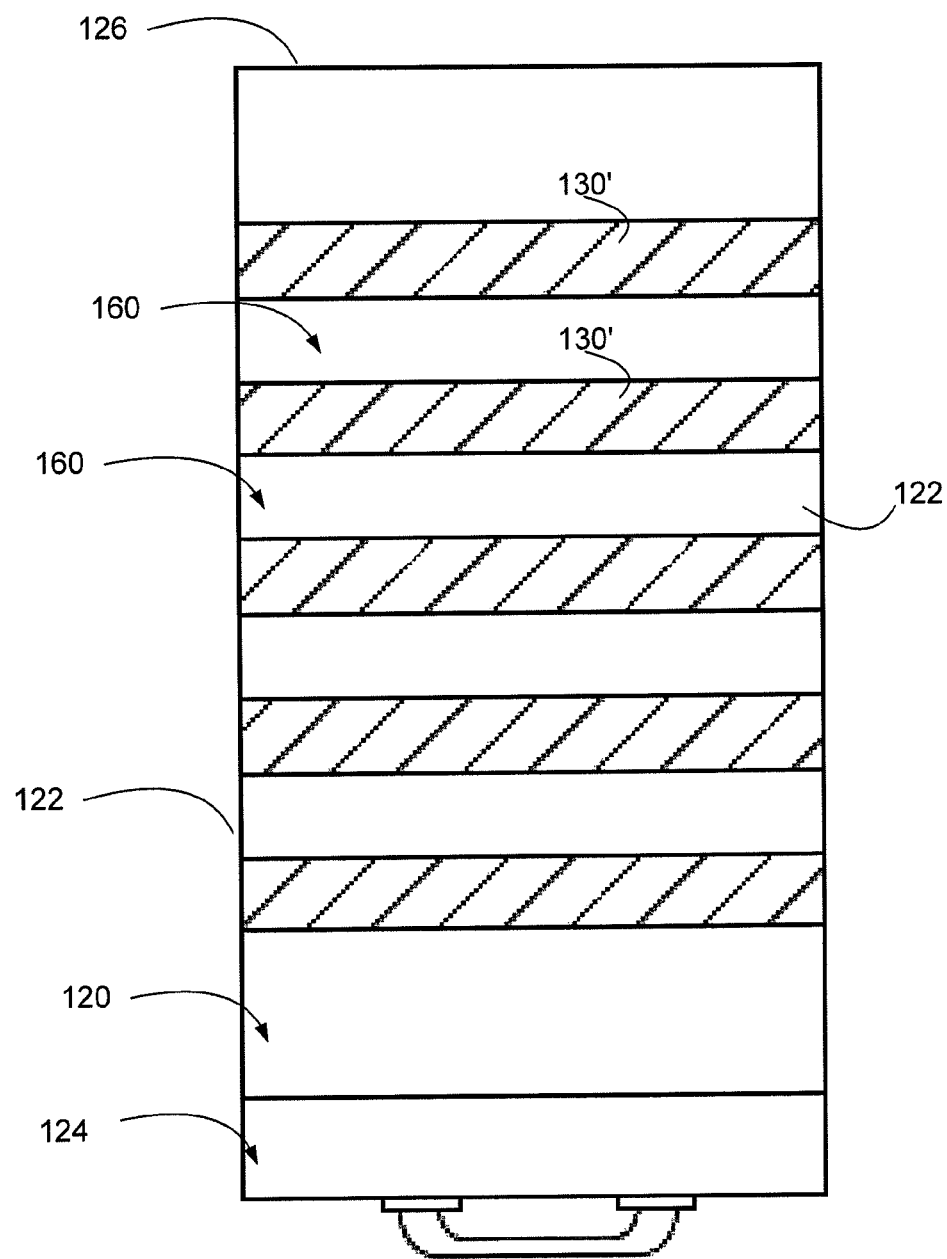
FIG. 7 shows a top view of the cable drawer according to this example embodiment.
Figure 8:
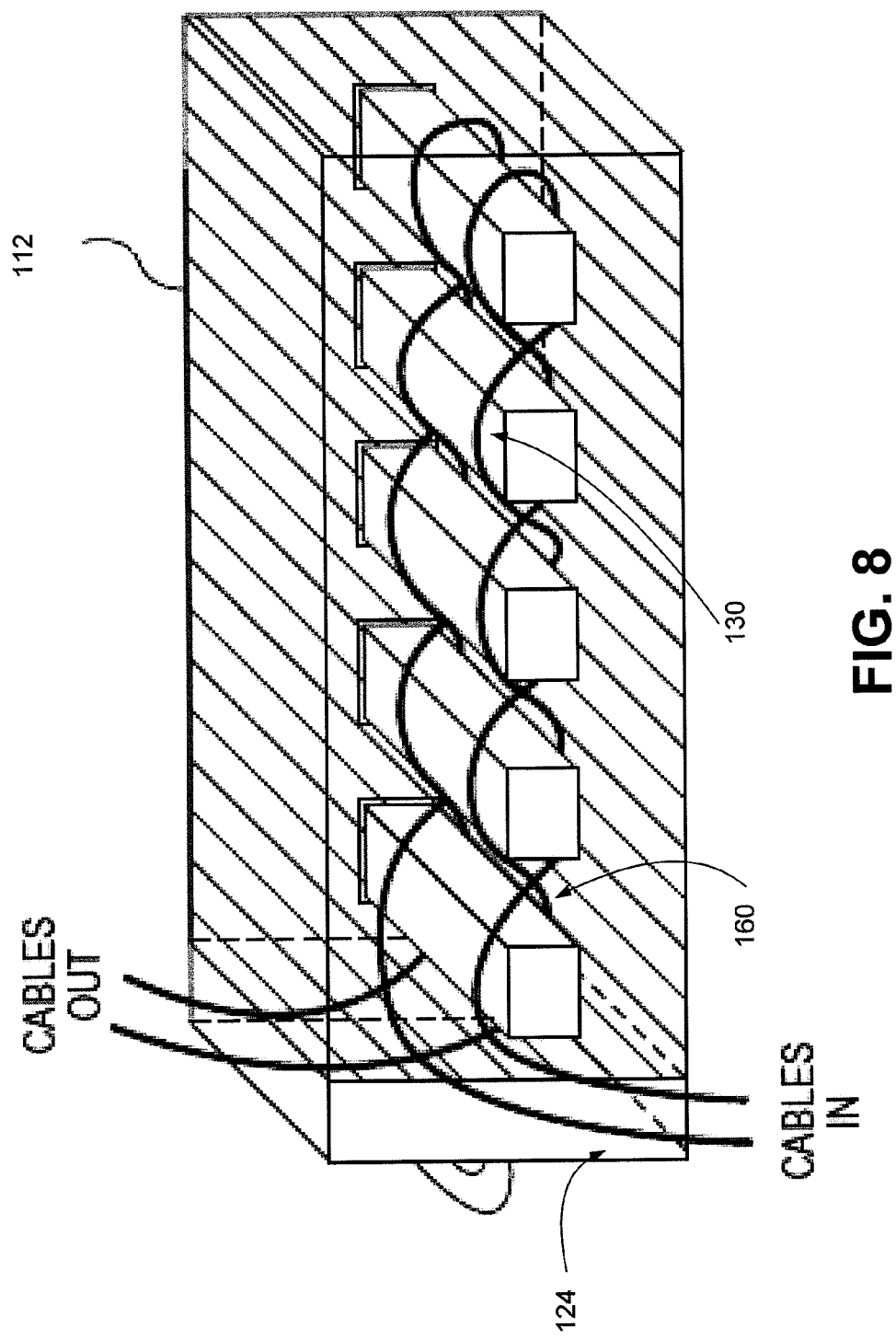
FIG. 8 shows a side view of the cable drawer with transparent side members to permit viewing of the contents of the cable drawer for ease of explanation according to an example embodiment.

In an alternative example, rather than including the orifices 140, a planar surface 130' may be provided with slots 160 through which cable can be twined. FIGS. 7 and 8 illustrate examples in which the planar surface 130' includes slots 160. FIG. 7 shows a top view of the cable drawer 112 according to this example embodiment. FIG. 8 shows a side view of the cable drawer 112 with transparent side members to permit viewing of the contents of the cable drawer 112 for ease of explanation. In some cases, the planar surface 130' may extend from one side members 122 to the other and the slots 160 may also extend from one side members 122 to the other as shown in FIGS. 7 and 8. However, other arrangements are also possible such as the slots 160 only extending over a portion of the width of the planar surface 130'. Furthermore, it should be appreciated that the horizontally extending members in FIGS. 7 and 8 could be extended vertically, could include any number of members and could include members having any desirable shape (e.g., dowel shaped or otherwise having rounded edges).

Accordingly, embodiments of the present invention may provide for retractable cable drawers to be provided in cable ways to collect excess or slack cable. The cable drawers may include a planar surface through which the slack cable can be twined or wound in order to take up the slack in an organized fashion. The planar surface may have openings therein that take the form of slots or orifices through which the cables may be wound. Furthermore, in some cases, the slack cable may be spooled through the openings multiple times or not at all dependent upon the amount of slack to be taken. However, in an alternative example, one or more of the side member 122, the front member 120 and the back member 124 may themselves include the openings to permit winding of the cable through the openings to take up cable slack.

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. For example, although the above description refers to "drawer" enclosures and cable "drawers", it should be noted that the cable slack could be managed in any cable management module and thus the term "drawer" is merely used for exemplary purposes. The cable management module may be any retractable apparatus that has at least a frame (with or without any sidewalls and/or top/bottom walls) cable of supporting a structure or structures for permitting cable to be wound around the structure(s) to take up cable slack as described above.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A cable slack management system, comprising:
a frame comprising a plurality of perimeter frame members to provide support for a plurality component modules, the plurality of component modules locatable between a first frame member of the plurality of perimeter frame members and a second frame member of the plurality of perimeter frame members, wherein the second frame member is parallel to the first frame member; and
a cable management module coupled to the first frame member and configured to slide into and out of the first frame member, wherein the cable management module is:
configured to hold a portion of one or more cables that run along the first frame member, and
coupled to the first frame member by a drawer enclosure positioned within the first frame member.

2. The cable slack management system of claim 1, wherein the cable management module is slidable into open and closed positions and includes at least two openings configured to allow the one or more cables to pass into and out of the cable management module.

3. The cable slack management system of claim 1, wherein the cable management module comprises a bottom member and wherein the cable management module further comprises two side members, a front member, and a back member, each extending perpendicular to the bottom member.

4. The cable slack management system of claim 3, wherein at least one of the two side members, the front member, and the back member include two or more openings configured to permit a twining of the one or more cables.

5. The cable slack management system of claim 3, wherein the cable management module comprises a planar surface coupled to the front member by a hinge configured to allow the planar surface to tilt out of the cable management module.

6. The cable slack management system of claim 3, wherein at least a portion of the two sides is coupled to the bottom member by a hinge configured to allow each side member to tilt away from a center of the cable management module.

7. The cable slack management system of claim 1, wherein the cable management module comprises a front member and a planar surface coupled to the front member.

8. The cable slack management system of claim 7, wherein the planar surface includes two or more openings to twine the one or more cables.

9. The cable slack management system of claim 8, wherein the openings are orifices through the planar surface.

10. The cable slack management system of claim 8, wherein the openings are slots extending across the planar surface.

11. A cable management system for a rack mount network platform, the cable management system comprising:
- a rack frame comprised of a plurality of perimeter frame members to provide support for a plurality of component modules insertable through a module insertion area on a first side of the rack frame having a first frame member of the plurality of perimeter frame members and a second frame member of the plurality of perimeter frame members, wherein the second frame member is parallel to the first frame member;
- a plurality of shelves coupled to the perimeter frame members within the rack frame, each shelf having a first surface and a second surface, the plurality of shelves substantially parallel to each other and substantially perpendicular to the plane of the first side of the rack;
- one or more modules inserted through the module insertion area between the first frame member and the second frame member, wherein at least one of the one or more modules is in operable communication with one or more cables and is included in the plurality of component modules; and
- one or more cable management modules coupled to at least one of the first frame member and the second frame member, each cable management module configured to slide into and out of a corresponding one of the first frame member or the second frame member, the cable management module being configured to hold a portion of the one or more cables configured to run along the corresponding one of the first frame member or the second frame member, and wherein each cable management module is coupled to its respective frame member by a drawer enclosure positioned at the corresponding one of the first frame member or the second frame member.

12. The cable management system of claim 11, wherein each cable management module is slidable into open and closed positions and includes at least two openings configured to allow the one or more cables to pass into and out of the cable management module.

13. The cable management system of claim 11, wherein each cable management module comprises a bottom member and wherein each cable management module further includes two side members, a front member, and a back member, each extending perpendicular to the bottom member.

14. The cable management system of claim 13, wherein at least one of the two side members, the front member, and the back member includes two or more openings configured to twine the one or more cables.

15. The cable management system of claim 13, wherein the cable management module comprises a planar surface coupled to the front member by a hinge configured to allow the planar surface to tilt out of the cable management module.

16. The cable management system of claim 13, wherein at least a portion of each of the two side members is coupled to the bottom member by a hinge configured to allow each side member to tilt away from a center of the cable management module.

17. The cable management system of claim 11, wherein the cable management module comprises a front member and a planar surface coupled to the front member, the planar surface including two or more openings to twine the one or more cables.

18. The cable management system of claim 17, wherein the openings are holes or slots through the planar surface.

* * * * *